United States Patent [19]

Poulin

[11] Patent Number: 5,554,879
[45] Date of Patent: Sep. 10, 1996

[54] HIGH VOLTAGE COMPONENT HAVING A LOW STRAY CURRENT

[75] Inventor: François Poulin, Tours, France

[73] Assignee: SGS-Thomson Microelectronics, S.A., Gentilly, France

[21] Appl. No.: 330,421

[22] Filed: Oct. 28, 1994

Related U.S. Application Data

[63] Continuation of Ser. No. 52,271, Apr. 20, 1993, abandoned, which is a continuation of Ser. No. 747,369, Aug. 20, 1991, abandoned.

[30] Foreign Application Priority Data

Aug. 21, 1990 [FR] France ................................. 90 10738

[51] Int. Cl.$^6$ ................................................. H01L 29/00
[52] U.S. Cl. ............................................ 257/506; 257/509
[58] Field of Search ....................................... 257/455, 506, 257/509

[56] References Cited

U.S. PATENT DOCUMENTS

| | | |
|---|---|---|
| 3,806,771 | 4/1974 | Petruzella . |
| 4,148,053 | 4/1979 | Bosselaar et al. . |
| 4,468,686 | 8/1984 | Rosenthal . |
| 4,766,474 | 8/1988 | Nakagawa et al. . |
| 5,003,372 | 3/1991 | Kim et al. ............................... 257/509 |
| 5,060,047 | 10/1991 | Jaume et al. . |
| 5,077,224 | 12/1991 | Schwarzbauer et al. . |

FOREIGN PATENT DOCUMENTS 5378999  1/1980  Japan .

*Primary Examiner*—Stephen Meier
*Attorney, Agent, or Firm*—Robert Groover; Betty Formby

[57] ABSTRACT

A high voltage semiconductor component having a low stray current comprises a central region ($N^-$) surrounded by P-type layers ($P_1$, $P_2$) forming with the central region first and second junctions ($J_1$, $J_2$). The first and second junctions have an apparent perimeter on a same main surface of the component. A groove is formed between said apparent perimeters and is filled with a passivation glass (18). The surface of the glass is covered, above the perimeter of each junction, with a metallization (21, 22) contacting the layer of the second conductivity type corresponding to the junction.

20 Claims, 2 Drawing Sheets

HIGH VOLTAGE COMPONENT HAVING A LOW STRAY CURRENT

This is a continuation application of application Ser. No. 08/052,271, filed Apr. 20, 1993 now abandoned which is a continuation of U.S. Pat. No. 07/747,369 now abandoned, filed Aug. 20, 1991.

BACKGROUND OF THE INVENTION

The present invention relates to a semiconductor component structure with an insulating peripheral well, liable to block a voltage applied according to its main terminals.

The following description refers more particularly to a thyristor, but it will be apparent to those skilled in the art that the invention generally applies to well-type semiconductor components comprising blocking junctions on each side of a semiconductive region having a low conductivity.

The state of the art will first be recalled in connection with FIGS. 1 to 4 which show schematic cross sections of various types of thyristors. It will be apparent to those skilled in the art that the figures are not to scale but that the sizes and thicknesses of various regions are arbitrarily drawn to facilitate the legibility of the figures, as usual in the field of semiconductor components.

A thyristor is a four-layers semiconductive component comprising a cathode layer N, a base layer $P_1$, a substrate region $N^-$ and an anode layer $P_2$. A cathode metallization K is formed on the cathode layer N, a gate metallization G is in contact with a part of the base layer $P_1$, and an anode metallization A is formed on the anode layer $P_2$. The thyristor is capable of blocking a positive or negative voltage applied between its main terminals A and K and conducts a current resulting from a positive voltage applied between anode and cathode when a current is injected in the gate.

In direct polarization (positive anode, negative cathode), and in the absence of a gate signal, junction $J_1$ between the region $N^-$ and the layer $P_1$ is blocking. In reverse biasing (negative anode and positive cathode) junction $J_2$ between layer $P_2$ and region $N^-$ is blocking.

Theoretically, the breakover voltage of the blocking junction depends upon the doping gradient between layers $P_1$ and $N^-$ on the one hand and between layers $P_2$ and $N^-$ on the other hand, and also upon the thickness of region $N^-$. Practically, the breakover voltages are mainly determined by the quality of the periphery of the junctions at the level of the external surfaces of the component, which will be called hereinafter apparent parameter of the junctions.

FIG. 1 shows a mesa type thyristor wherein the upper side and lower side peripheries of the thyristor are grooved, the upper groove crossing junction $J_1$ and the lower groove crossing junction $J_2$. Those grooves are glassivated, that is filled with a glass designated by reference 11 for the upper groove and by reference 12 for the lower groove. So, the upper and lower surfaces of the thyristor form mesas. The angle of the grooves at the apparent perimeter of junctions $J_1$ and $J_2$, their polishing, and the quality of the passivation are the parameters, already thoroughly studied, which determine the breakover voltage of the junctions. Presently, this type of structure provides thyristors having the highest breakover voltages (higher than one thousand volts).

However, the mesa type technology presents some basic limits; in particular, it is not compatible with the usual processes of automatic assembling. To solve this problem, well-type structures have been developed, as shown in FIGS. 2 and 3 wherein deep P-type diffusions $P_3$ are formed the periphery of the thyristor and are electrically continuous with layer $P_2$. The region $N^-$ is apparent at the upper surface of the thyristor and the apparent perimeters of junctions $J_1$, $J_2$ are on this upper surface.

FIG. 2 shows the simplest passivation mode of junctions $J_1$ and $J_2$ according to which, in conformity with the conventional planar technology, the apparent perimeters of the junctions are passivated by a simple oxide layer 13. To improve the voltage supported by these junctions, a metallization, called field plate, is formed above each junction. The first field plate 15 covers junction $J_1$ and is electrically connected with the region $P_1$ or gate G. The second field plate 16 covers junction $J_2$ and is electrically connected to the well $P_3$. The length of each field plate above region $N^-$ is a parameter which determines the breakover voltage of the underlying junction. However, with such structures, the breakover voltage of the junctions is not much above hundreds of volts, at best 400 volts. To improve this result, the field plates and the interval between the field plates have been covered with an additional mineral passivation layer (CVD $SiO_2$ and silicon nitride) or non mineral passivation (polyimide) but this complicates the process in exchange for a relatively low improvement. The voltage breakdown is then at best 600 volts.

In the structures of FIGS. 1 and 2, there is no stray current problem, that is, when the junctions are reverse biased, the stray current between the anode and the cathode is lower than one microampere.

FIG. 3 shows a known solution to improve the breakover voltage of a well-type thyristor. The apparent surface of region $N^-$ is grooved so as to cut junctions $J_2$ and $J_1$. The groove is filled with a glass 18. Then, a satisfying breakover voltage is obtained, in the same range as obtained with mesa type thyristors. However, a new problem arises, i.e., a relatively high stray current appears when the thyristor is blocked in the direct or reverse direction, in particular when the device is hot. This stray current is not stable and sometimes reaches high values such as tens, or hundreds of microamperes.

The stray current in the structure of FIG. 3 is likely caused by fixed or mobile negative charges in glass 18.

In the case of mesa structures as shown in FIG. 1, the effect of the charges is to increase the breakover voltage of each of the junctions $J_1$ and $J_2$ by locally compensating the N type concentration of the silicon intrinsic region ($N^-$).

In the case of FIG. 3, the presence of those negative charges in glass 18 causes a reversal of the conductivity type of the surface part of region $N^-$ and creates a channel, causing the presence of a stray current. To palliate this drawback, it has been suggested to use a structure as shown in FIG. 4, comprising, at the center of the surface portion of the $N^-$ region, a $N^+$ diffusion region 19 called a channel stop. Such a channel stop efficiently reduces the stray current which becomes lower than one microampere. However, such a structure has many drawbacks, that is, on the one hand, its difficult implementation which implies additional manufacturing steps and, on the other hand, the fact that the distance e between the limit of each junction and the $N^+$ region 19 has to be higher than the thickness of region $N^-$.

A structure of the type disclosed in FIG. 4 is for example disclosed in U.S. Pat. No. 4,148,053 which also teaches a double groove structure. This patent also suggests the use of field plates for their conventional function of spreading the field lines and not for a reduction of the stray current. An apparent drawback of the structure disclosed in this patent is that it occupies a large area.

SUMMARY OF THE INVENTION

The object of the invention is to provide a semiconductor component structure, for example a thyristor, exhibiting the advantages of the well-type structures but avoiding the stray currents in the blocking state without increasing the silicon surface of the component.

To attain these objects, the present invention provides a high voltage semiconductor component having a low stray current comprising a central region of a first conductivity type with a low doping level surrounded by layers of the second conductivity type with an higher doping level forming with the central region first and second junctions liable to hold said high voltage. The first and second junctions are apparent on a same main surface of the component, on both sides of an apparent surface of said central region, and a groove is formed in all said apparent surfaces and is filled with a passivation glass. The surface of the glass is covered, above the perimeter of each junction, with a metallization contacting the layer of the second conductivity type corresponding to the junction.

BRIEF DESCRIPTION OF THE DRAWINGS

Those objects, features and advantages and others of the invention will be disclosed in detail in the following description of preferred embodiments made in relation with the attached drawings wherein.

DETAILED DESCRIPTION OF THE INVENTION

Figure 5:
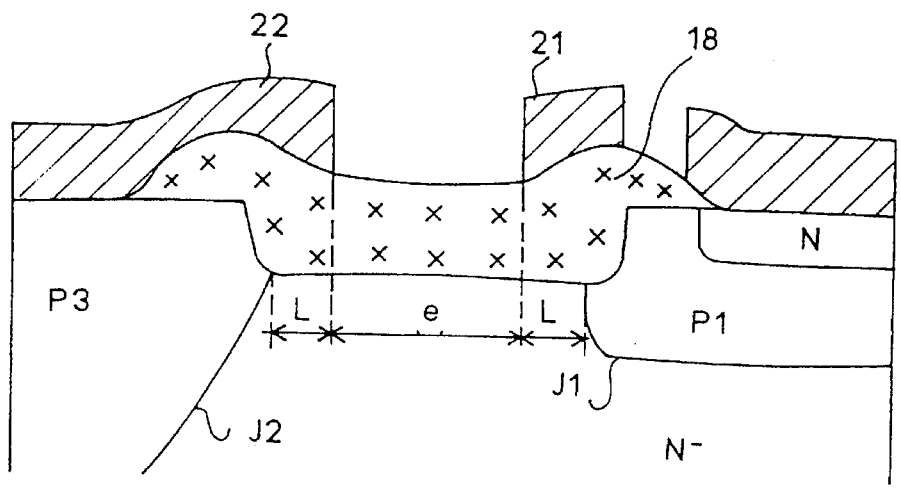
FIG. 5 is a partial cross-section of a junction insulation region according to the invention.

As shown in FIG. 5, according to the invention, to suppress the stray currents, metallizations 21 and 22 are provided above the glassivation layer 18, respectively above junctions $J_1$ and $J_2$. Metallization 21 above junction $J_1$ is connected (not shown) to region $P_1$ and metallization 22 above junction $J_2$ is connected to the well $P_3$.

Figure 1:
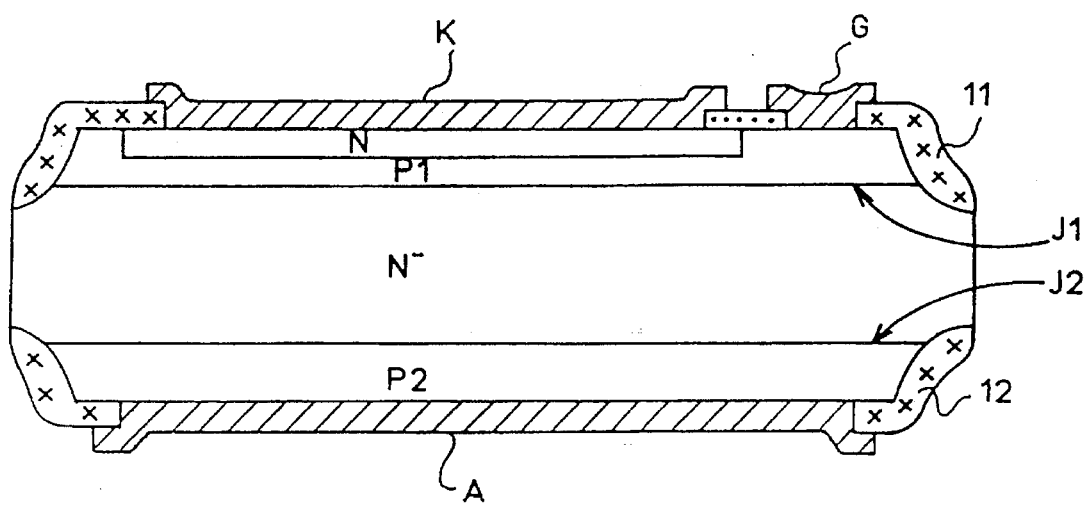
FIGS. 1–3 are schematic cross-sections of conventional thyristors.
Figure 2:
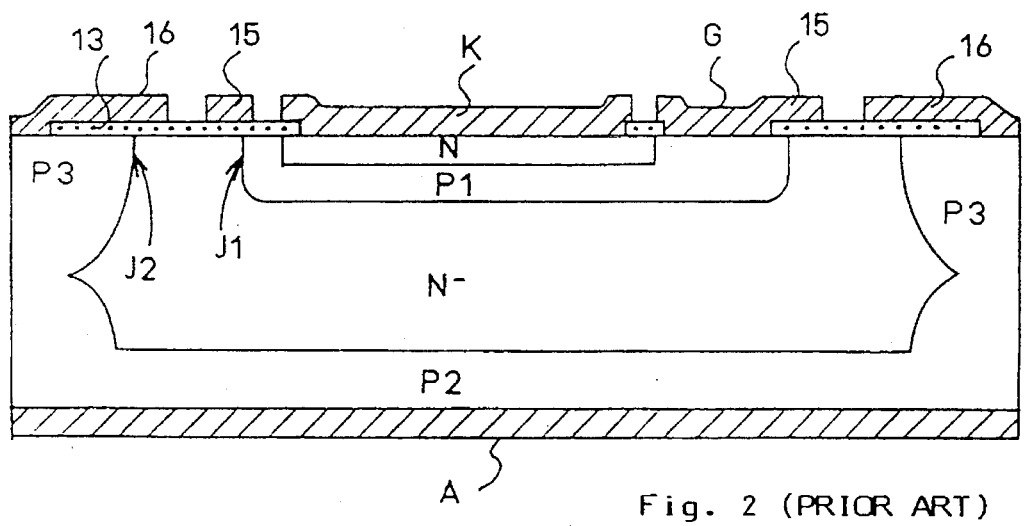
Figure 3:
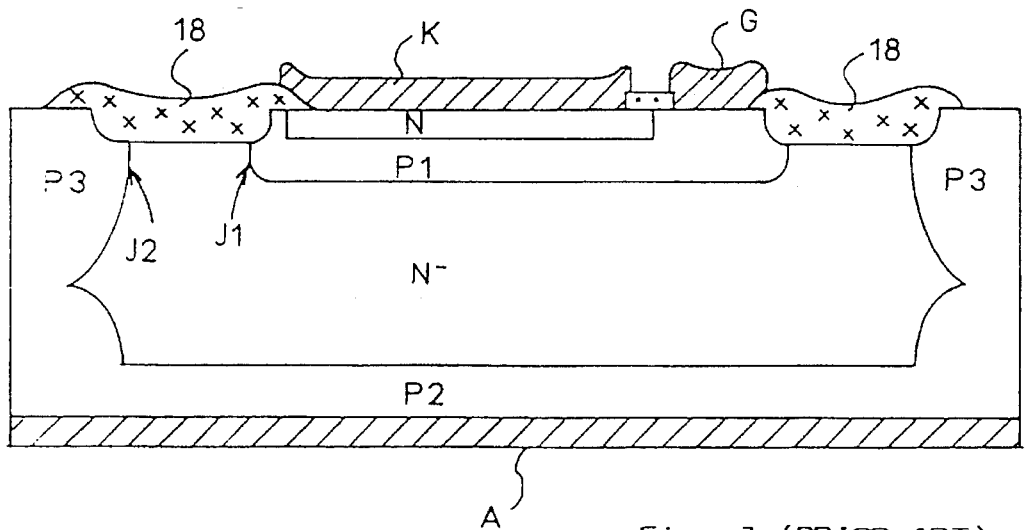

Those metallizations, although similar to the field plates of FIG. 2, do not have the same function and their size is not determined by the same parameters.

Figure 4:
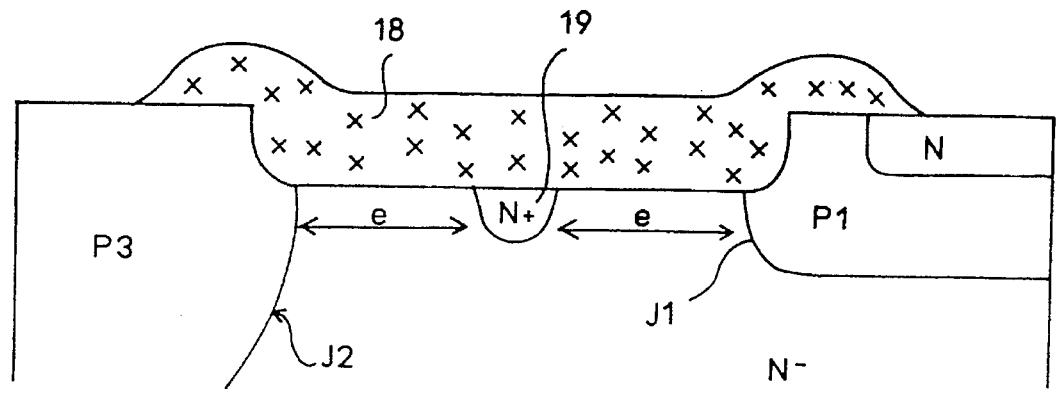
FIG. 4 is a partial cross-section of a conventional junction insulation region.

Those metallizations, by an electrostatic effect, neutralize the channel region by applying a reverse field with respect to the negative charges existing in the glassivation 18. When junction $J_1$ is blocking, region $P_3$ which is at a positive potential transfers this potential to metallization 22 to cancel the channel. It will be noted that it is the metallization opposite to the blocking junction which has an active function. Contrarily to the case of the field plates of FIG. 2, the distance L between a junction and the projection of the extremity of the above metallization is not critical. A distance L of about ten micrometers is sufficient for obtaining the channel cancellation effect. It is the distance between the two metallizations which determines the breakover voltage and which has to be at least equal to the distance $\underline{e}$ of FIG. 4. Thus, as L is much lower than $\underline{e}$, the distance between the apparent perimeters of the two junctions (e+2L) is, in the case of FIG. 5, much lower than in the case of FIG. 4 where it is higher than 2e. Thus, according to the invention, a simple and compact structure is obtained. Additionally, the implementation of the metallizations according to the invention does not imply any additional manufacturing step with respect to the normal manufacturing steps of a thyristor.

Although the invention has been disclosed in connection with a thyristor for simplifying the description, it will be clear that configurations analogous to the one shown in FIG. 5 can appear in any bidirectional high voltage component, for example a triac, and that the present invention will apply in the same way to those components.

I claim:

1. A high voltage semiconductor component having a low stray current comprising a central region of a first conductivity type with a low doping level, surrounded by layers of the second conductivity type with a higher doping level, which form, with said central region, first and second junctions liable to hold said high voltage, wherein the first and second junctions have respective apparent perimeters, on a main surface of the component, which lie on both sides of an apparent surface of said central region, and wherein a groove is formed over both said apparent perimeters and is filled with a glassivation layer, the surface of said glassivation layer being covered, above the perimeter of each junction, with a metallization contacting the respective layer of the second conductivity type corresponding to the junction.

2. A high voltage semiconductor current according to claim 1, forming a thyristor comprising:

a lightly doped first-conductivity-type substrate which constitutes said central region, a second second-conductivity-type layer formed on all the lower surface of the thyristor, a deep second-conductivity-type well at the periphery of the thyristor, the contact region between the portion of the well facing said second second-conductivity-type layer and said central region forming the apparent perimeter of the second junction, a first second-conductivity-type layer, in a part of the upper surface of the main region, not contacting the well and forming, at the surface of the component, said first junction with said central region, and a first-conductivity-type cathode region formed in the first second-conductivity-type region.

3. The device of claim 2, wherein said first conductivity type is N type.

4. The device of claim 1, wherein said first conductivity type is N type.

5. A high voltage solid-state device, comprising:

first and second current-carrying terminals, said first current-carrying terminal being connected to a first semiconductor region at a first surface of a monocrystalline semiconductor portion, and said second current-carrying terminal being connected to a second semiconductor region which is not at said first surface;

a gate region and at least one other region interposed between said first and second semiconductor regions, said gate region and said other region defining at least one junction therebetween, said gate region also defining a junction with said first semiconductor region;

said gate region vertically and laterally surrounding said first region and said gate region being vertically and laterally surrounded by said other region;

a charged insulating passivation layer, overlying said other region at said first surface in proximity to said gate region;

a first metal electrode overlying said insulating region and said other region thereunder in proximity to said gate region, said first metal electrode being ohmically connected to said gate region;

a reach-up semiconductor region with electrical continuity to said second semiconductor region and which extends to said first surface; and a second metal electrode overlying said insulating layer and said other region thereunder in proximity to said reach-up region, and being ohmically connected to said reach-up region.

6. The device of claim 5, wherein said first current-carrying terminal makes ohmic contact to said gate region.

7. The device of claim 5, wherein said reach-up semiconductor region comprises a combination of updiffused and down-diffused impurities.

8. The device of claim 7, wherein said gate region is P-type.

9. The device of claim 5, wherein said monocrystalline semiconductor portion is silicon.

10. The device of claim 5, wherein said gate region is P-type.

11. The device of claim 5, wherein said charged insulating passivation layer is recessed into a groove in said first surface.

12. The device of claim 11, wherein said gate region is P-type.

13. The device of claim 5, wherein said charged insulating passivation layer is a glassivation layer.

14. The device of claim 5, wherein said charged insulating passivation layer comprises excess negative charges.

15. The device of claim 14, wherein said gate region is P-type.

16. A high voltage solid-state device, for selectably blocking a high voltage in either direction, comprising:

first, second, and third semiconductor regions, said first region laterally separating and having the opposite conductivity type to said second and third regions; said first region forming a first junction with said second region and a second junction with said third region;

connections for applying said high voltage substantially between said second and third regions;

a charged insulating passivation layer, overlying said first region and said first and second junctions;

a first conductive transistor gate, operatively connected to said second region and overlying said passivation layer above said first junction and part of said first region; and a second conductive transistor gate, operatively connected to said third region and overlying said passivation layer above said second junction and part of said first region.

17. The device of claim 16, wherein said first region is N type.

18. The device of claim 16, wherein said third region is deeper than said second region.

19. The device of claim 16, wherein said third and second regions are both more heavily doped than said first region.

20. The device of claim 16, wherein said charged insulating passivation layer comprises excess negative charges.

* * * * *